US005859794A

United States Patent [19]
Chan

[11] Patent Number: 5,859,794
[45] Date of Patent: Jan. 12, 1999

[54] MULTILEVEL MEMORY CELL SENSE AMPLIFIER SYSTEM AND SENSING METHODS

[75] Inventor: John Y. Chan, San Carlos, Calif.

[73] Assignee: NuRam Technology, Inc., Santa Clara, Calif.

[21] Appl. No.: 874,794

[22] Filed: Jun. 13, 1997

Related U.S. Application Data

[63] Continuation of Ser. No. 664,601, Jun. 17, 1996, Pat. No. 5,684,736.

[51] Int. Cl.$^6$ .................................................. G11C 11/24
[52] U.S. Cl. .......................... 365/149; 365/205; 365/208
[58] Field of Search ............................... 365/149, 189.07, 365/190, 205, 207, 208

[56] References Cited

U.S. PATENT DOCUMENTS

| 4,771,404 | 9/1988 | Mano et al. | 365/189 |
|---|---|---|---|
| 5,283,761 | 2/1994 | Gillingham | 365/189.07 |
| 5,293,563 | 3/1994 | Ohta | 365/190 |
| 5,532,955 | 7/1996 | Gillingnam | 365/149 |
| 5,612,912 | 3/1997 | Gillingham | 365/149 |

OTHER PUBLICATIONS

Aoki et al., "A 16–Levels/Cell Dynamic Memory," 1985 IEEE International Solid–State Circuits Conference, *Digest of Technical Papers*, pp. 246–247 (Feb. 15, 1985).

Furuyama et al., "An Experimental 2–bit/Cell Storage DRAM for Macrocell or Memory–on–Logic Application," *IEEE Journal of Solid–State Circuits*, 24(2):388–393 (Apr. 1989).

Hidaka et al., "A Divided/Shared Bitline Sensing Scheme for 64Mb DRAM Core," 1990 Symposium on VLSI Circuits, pp. 15–16 (Feb. 1990).

Rich, "A Survey of Multivalued Memories," *IEEE Transactions on Computers*, C–35(2):99–106 (Feb. 1986).

*Primary Examiner*—Son Mai
*Attorney, Agent, or Firm*—Skjerven, Morrill MacPherson, Franklin & Friel; Alan H. MacPherson

[57] ABSTRACT

A dynamic random access memory device stores two bits of digital data in each memory cell. Two sense amplifiers are provided to sense and reproduce any of the four binary values 11, 10, 01, 00 representing a strong one, a weak one, a weak zero and a strong zero, respectively, capable of being stored in each cell. The signal read out of a memory cell is restored to the memory cell by a feedback circuit which utilizes the outputs of the sense amplifiers. Thus the proper charge is replaced on the selected storage capacitor in the memory cell.

27 Claims, 8 Drawing Sheets

MULTILEVEL MEMORY CELL SENSE AMPLIFIER SYSTEM AND SENSING METHODS

This application is a continuation of application Ser. No. 08/664,601, filed Jun. 17, 1996, U.S. Pat. No. 5,684,735.

FIELD OF THE INVENTION

This invention relates to data storage in a memory device, and more specifically to structure and methods for encoding, decoding and restoring data for storage in a multi-level dynamic semiconductor memory device.

BACKGROUND OF THE INVENTION

Since the invention of the single transistor dynamic memory cell, the basic rule of one transistor and one capacitor per stored bit has not changed. In order to pack more bits per unit of silicon area, more sophisticated lithographic equipment and methods are continuously being developed and used to fabricate these memory devices. Another way to achieve better density is to store more than one data bit per single memory cell. This is known commonly as multi-level cell memory. Prior art patents that discuss multi-level storage in dynamic semiconductor memory include U.S. Pat. No 5,293,563 of Ohta for MULTI-LEVEL MEMORY CELL WITH INCREASED READ-OUT MARGIN ("Ohta"). Ohta describes a dynamic semiconductor memory device using a memory cell consisting of two (2) transistors and a capacitor to store two bits of digital data. The result is a memory device using one and one-half (1.5) elements instead of two (2) elements per bit of storage. Ohta provides an enhanced cell signal storage with complementary polarities applied to the memory cell. One major disadvantage of the cell is its layout difficulty which results in larger than expected actual cell size.

U.S. Pat. No. 5,283,761 of Gillingham entitled METHOD OF MULTI-LEVEL STORAGE IN DRAM ("Gillingham") describes a DRAM memory cell capable of storing four (4) voltage levels. To do this, Gillingham subdivides the bit line, uses about six (6) precharge and equalizing clocks involving complex and difficult to generate clock timings (including some precharge and isolation clocks twice activated in a single cycle), and a dummy word line. The bit line sections also have to be charged, equalized and discharged twice in a single cycle, resulting in a slow memory device, not suitable for high speed dynamic operation in high density DRAMs.

SUMMARY OF THE INVENTION

In accordance with this invention, there is provided a DRAM memory architecture capable of the write, read, sense and restore or refresh operations, wherein two (2) bits of data can be stored in each DRAM memory cell. The write operation involves taking two (2) input bits of data, encoding these bits and storing the encoded bits into a memory cell. The read and restore or refresh operation processes a memory cell stored voltage by decoding this voltage into two (2) bits of data to be sent to the outside world and then restores the memory cell to its original stored voltage level. All is done with minimal additional transistors, compared to the prior art, and with speed comparable to conventional DRAM speed except with twice the bit density.

In one embodiment of the present invention, conventional DRAM bit lines and memory cell architecture are used with the following additional components:

a) an extra sense amplifier per bit line,
b) a feed back element per bit line,
c) transistor switches to break the reference bit line into two parts, and
d) an exclusive OR gate and related circuitry per bit line to selectively short one part of the reference bit line to the bit line so that the correct one of four possible proper voltage levels is restored to the storage cell.

A major feature of the present invention is that the storage of two bits in a single cell is achieved with a small layout capable of being implemented using present DRAM process technology.

This invention will be more fully understood in conjunction with the following detailed description taken together with the attached drawings.

DETAILED DESCRIPTION OF THE INVENTION

The storage of two bits in a single memory cell requires four different values to be stored in the memory cell. For convenience, these four values are defined as follows in the table.

TABLE

| NAME | FIRST BIT | SECOND BIT | VOLTAGE STORED | RANGE OF VALUES FOR VOLTAGE STORED |
|---|---|---|---|---|
| Strong one | 1 | 1 | V11 | V10 < V11 ≦ Vcc |
| Weak one | 1 | 0 | V10 | V01 < V10 < V11 |
| Weak zero | 0 | 1 | V01 | V00 < V01 < V10 |
| Strong zero | 0 | 0 | V00 | GND ≦ V00 < V01 |

Figure 1:
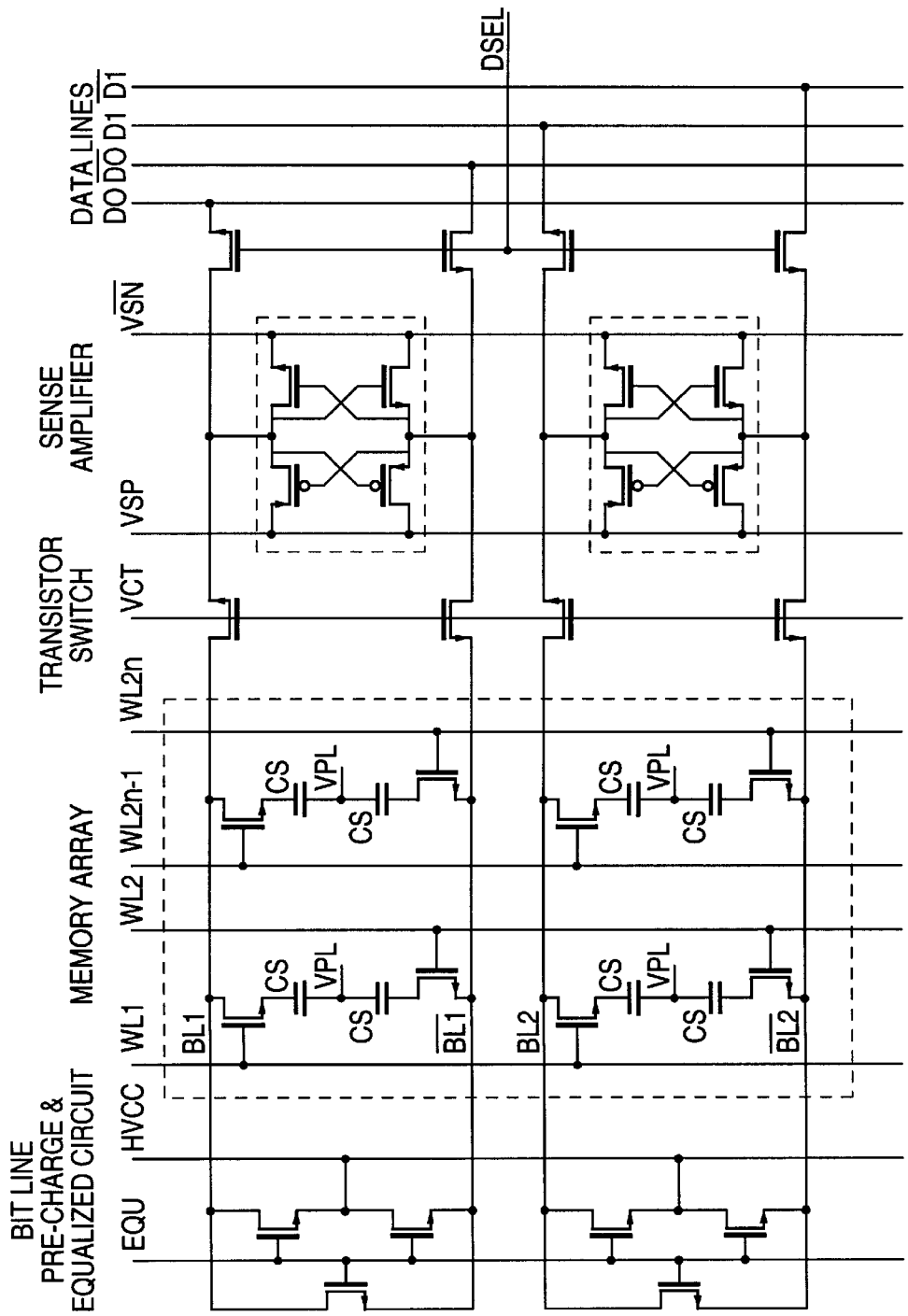
FIG. 1 is a circuit diagram showing a commonly used conventional dynamic semiconductor memory device structure.
Figure 2:
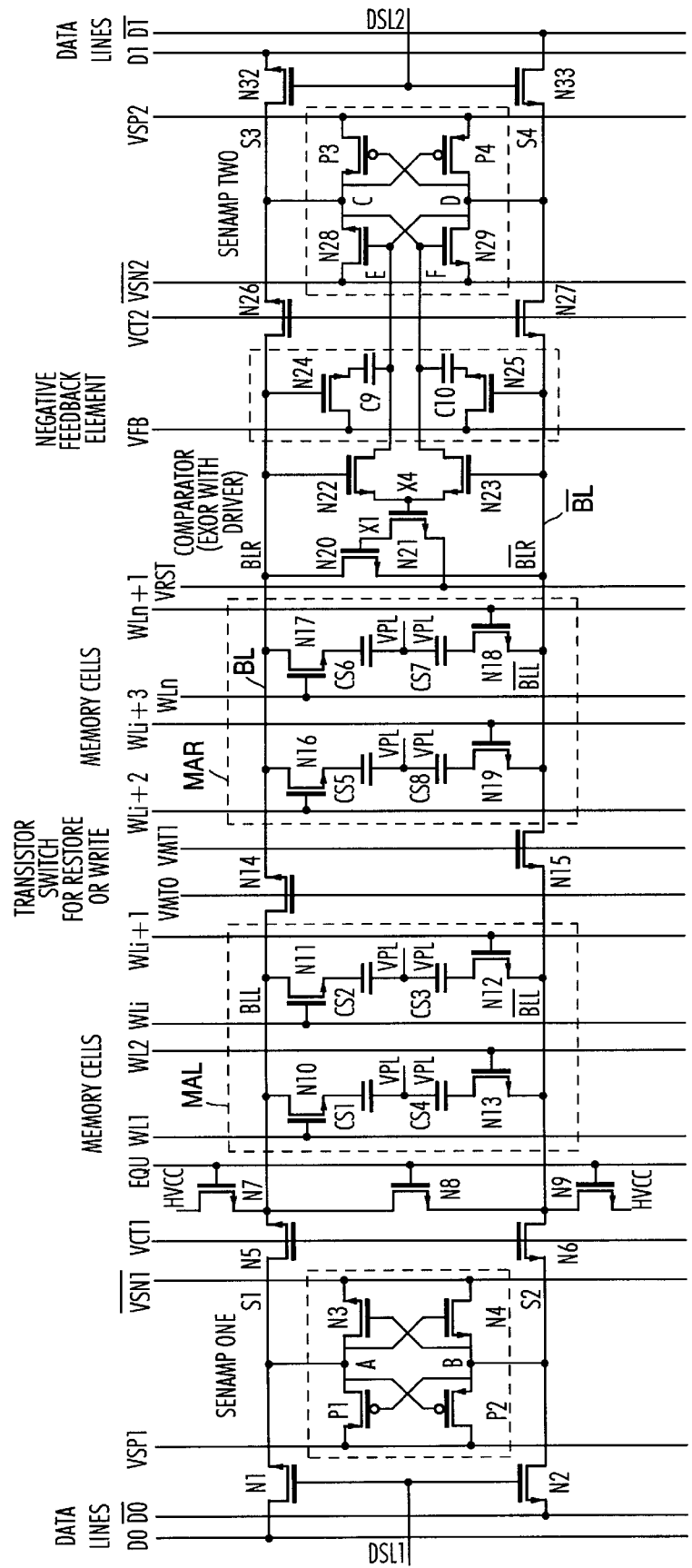
FIG. 2 is a circuit diagram showing a first embodiment of a dynamic semiconductor memory of the present invention.

FIG. 2 shows a portion of DRAM memory structure in a first embodiment of the present invention. A folded bit line consisting of bitline BL and reference bit line $\overline{BL}$ is shown.

Bit line BL includes a left bit line BLL to the left of transistor switch N14 and right bit line BLR to the right of transistor N14. When voltage VCC+ (VCC+ is a voltage somewhat higher than VCC) is applied via input VMT0 to the gate of transistor N14, then transistor 14 is "on" and the left bit line BLL is connected by the conducting channel of N14 to the right bit line BLR. When voltage GND is applied via input VMT0 to the gate of transistor N14, then transistor N14 is "off" and the left bitline BLL is electrically isolated from the right bitline BLR.

Likewise, reference bitline $\overline{BL}$ is divided by transistor switch N15 so that left reference bitline $\overline{BLL}$ is electrically isolated from right reference bit line $\overline{BLR}$ when voltage GND is applied via input VMT1 to the gate of transistor N15, and so that the left reference bitline $\overline{BLL}$ is connected to the right reference bit line $\overline{BLR}$ by the conducting channel of transistor N15 when VCC+ is applied to the gate of N15. Other folded bit lines (not shown but located above and below those shown), are divided by transistor switches analogous to N14 and N15 controlled by VMT0 and VMT1.

An array of memory cells, located to the left of the VMT0 and VMT1 input lines, is called the left memory array MAL. Likewise, the array of memory cells located to the right of the VMT0 and VMT1 input lines is called the right memory array MAR. The left bit line BLL is connected to memory cells in the left memory array MAL by access transistor switches, two of which N10 and N11 are shown, and the left reference bit line $\overline{BLL}$ is connected to memory cells in the left memory array MAL by access transistor switches, two of which N12 and N13 are shown. Likewise, the right bit line BLR is connected to memory cells in the right memory array MAR by access transistor switches, only two of which (N16 and N17) are shown, and the right reference bit line $\overline{BLR}$ is connected to memory cells in the right memory array MAR by access transistor switches, only two of which (N18 and N19) are shown.

Word lines WL1, WL2, WLi and WLi+1 (where i is some integer) control access transistor switches N10, N13, N11 and N12, respectively, in the left memory array MAL. For clarity in the drawing, a number of word lines and associated memory cells have been omitted between word lines WL2 and WLi. Likewise, a number of word lines and associated memory cells have been omitted between word lines WLi+3 and WLn in the right memory array MAR. The number of word lines in the left memory array, including those omitted for clarity, is (i+1), and the number of word lines in the right memory array, including those omitted for clarity, is (n−i). The width of the left memory array, indicated by the number (i+1) of word lines, is, in one embodiment, approximately equal to the width of the right memory array, indicated by the number (n−i) of word lines. In this embodiment then, the capacitances, CBLL of left bitline BLL, CBLR of right bit line BLR, $\overline{CBLL}$ of left reference bit line $\overline{BLL}$, and C $\overline{BLR}$ of right reference bit line $\overline{BLR}$ are made approximately equal.

Two sense amplifiers, sense amp one and sense amp two, are shown in FIG. 2. Transistor switches N5 and N6, both controlled by the voltage on the VCT1 input line, allow both bit line BL and reference bit line $\overline{BL}$ to be connected to bus S1 and bus S2, respectively, and hence to sense amp one. Likewise, transistor switches N26 and N27, both controlled by the voltage applied to input line VCT2, allow both bitline BL and bit line $\overline{BL}$ to be connected to buses S3 and S4, respectively, and hence to sense amp two.

Four memory cells in the left memory array MAL are shown in FIG. 2, the first memory cell in the upper left hand corner being made up of N channel access transistor N10 and storage capacitor CS1, and then going clockwise, the second memory cell being made up of N channel access transistor N11 and capacitor CS2, the third memory cell being made up of N channel access transistor N12 and capacitor CS3 and the fourth memory cell being made up of N channel access transistor N13 and capacitor CS4.

Four memory cells in the right memory array MAR are also shown in FIG. 2, each memory cell being made up of an access transistor and a storage capacitor, the first memory cell in the upper left hand corner consisting of N channel transistor N16 and storage capacitor CS5, the second memory cell clockwise in the upper right hand corner consisting of N channel access transistor N17 and storage capacitor CS6, the third memory cell in the lower right hand corner consisting of N channel access transistor N18 and storage capacitor CS7 and the fourth memory cell in the lower left hand corner consisting of N channel access transistor N19 and storage capacitor CS8.

While only eight memory cells and one folded bit line consisting of bit line BL and reference bit line $\overline{BL}$ are shown in FIG. 2 it should be understood that an actual integrated circuit DRAM memory, in accordance with the invention, would contain a plurality of memory cells and a multiplicity of folded bit lines similar to those shown in FIG. 2. Thus FIG. 2 illustrates only a small portion of what would be present in an actual DRAM integrated circuit memory structure in accordance with this invention.

To illustrate the operation of this invention, assume that one of the four defined voltages V11, V10, V01 or V00, representing binary 11, binary 10, binary 01 and binary 00, respectively, is stored on capacitor CS1. To read out the stored voltage from CS1, either in order to restore this voltage during a normal refresh operation (DRAM memories must be refreshed periodically to maintain the memory in the proper state), or to provide the signal contained on CS1 to the external circuity so that the system can utilize the information contained on capacitor CS1, the following operations occur.

Figure 3:
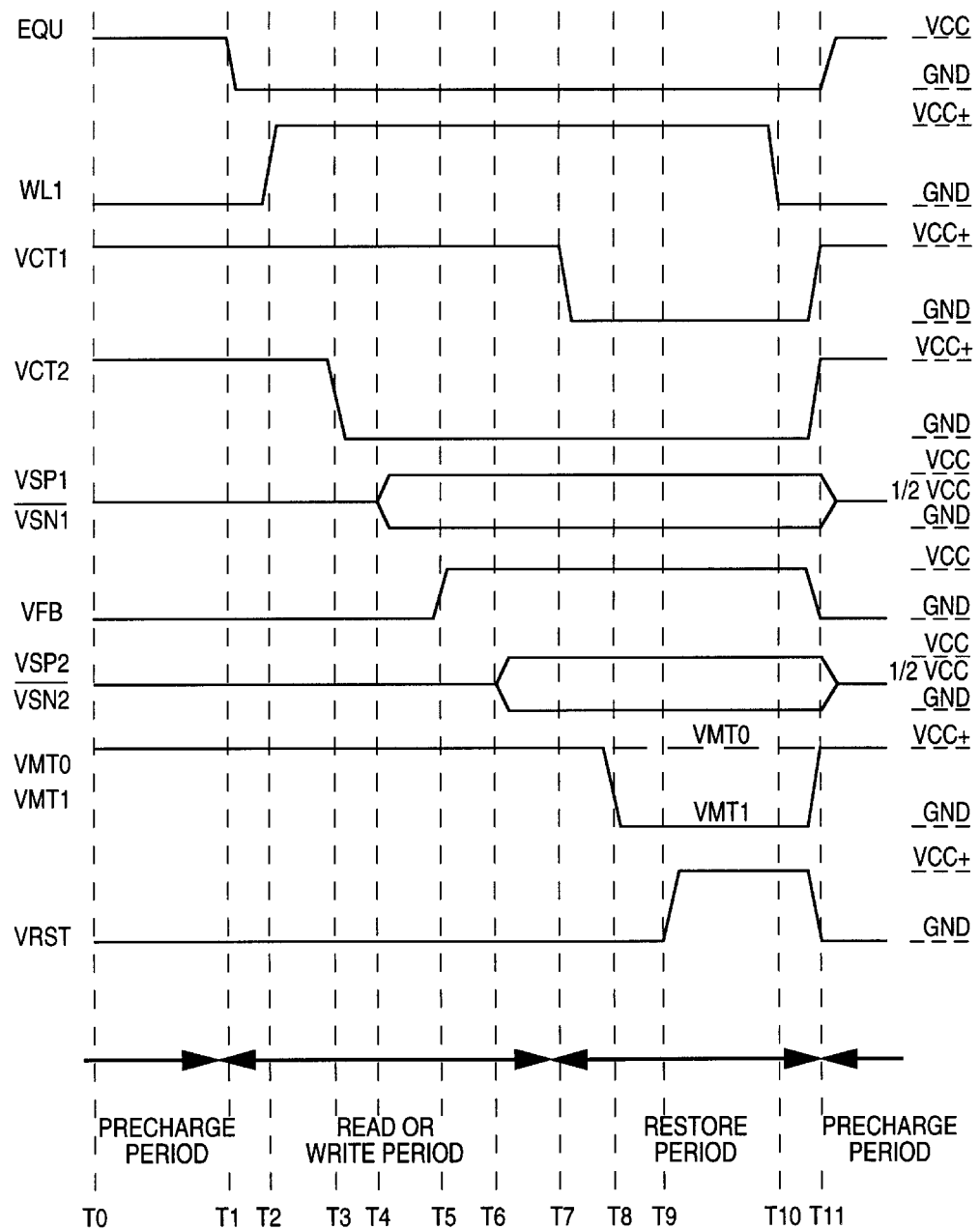
FIG. 3 is a timing chart showing the sequence of input voltage changes applied to the DRAM of FIG. 2 during a read and restore operation.

First, referring to FIGS. 2 and 3, the bit line BL and reference $\overline{BL}$ are precharged to a selected voltage, for example to ½ VCC. During the precharge period the voltage VCC+ is applied through lead VCT1 to transistors N5 and N6, through lead VMT0 to transistor N14, through lead VMT1 to transistor N15, and, through lead VCT2 to transistors N26 and N27, so that all these transistor switches are "on". The voltage Vcc is applied to lead EQU to turn "on" equalizing transistor N8 and also to turn "on" pass transistors N7 and N9 to equalize the bit line BL and reference bit line $\overline{BL}$ at the voltage ½ VCC which is applied to the HVCC input leads (HVCC meaning "half Vcc"). At the end of the precharge period, that is at time T1, the voltage applied to EQU goes low to GND thereby turning "off" equalizing transistor N8 and pass transistors N7 and N9 and leaving bit line BL and reference bit line $\overline{BL}$ and buses S1, S2, S3, and S4 at ½ Vcc.

Now the read period begins. At time T2, the voltage on word line WL1 is taken high to VCC+. This turns "on" N channel access transistor N10 so that the charge on capacitor CS1 is redistributed between bit line BL, bus S1, and bus S3 (all of which have been precharged to ½ Vcc), and memory capacitor CS1.

Figure 4:
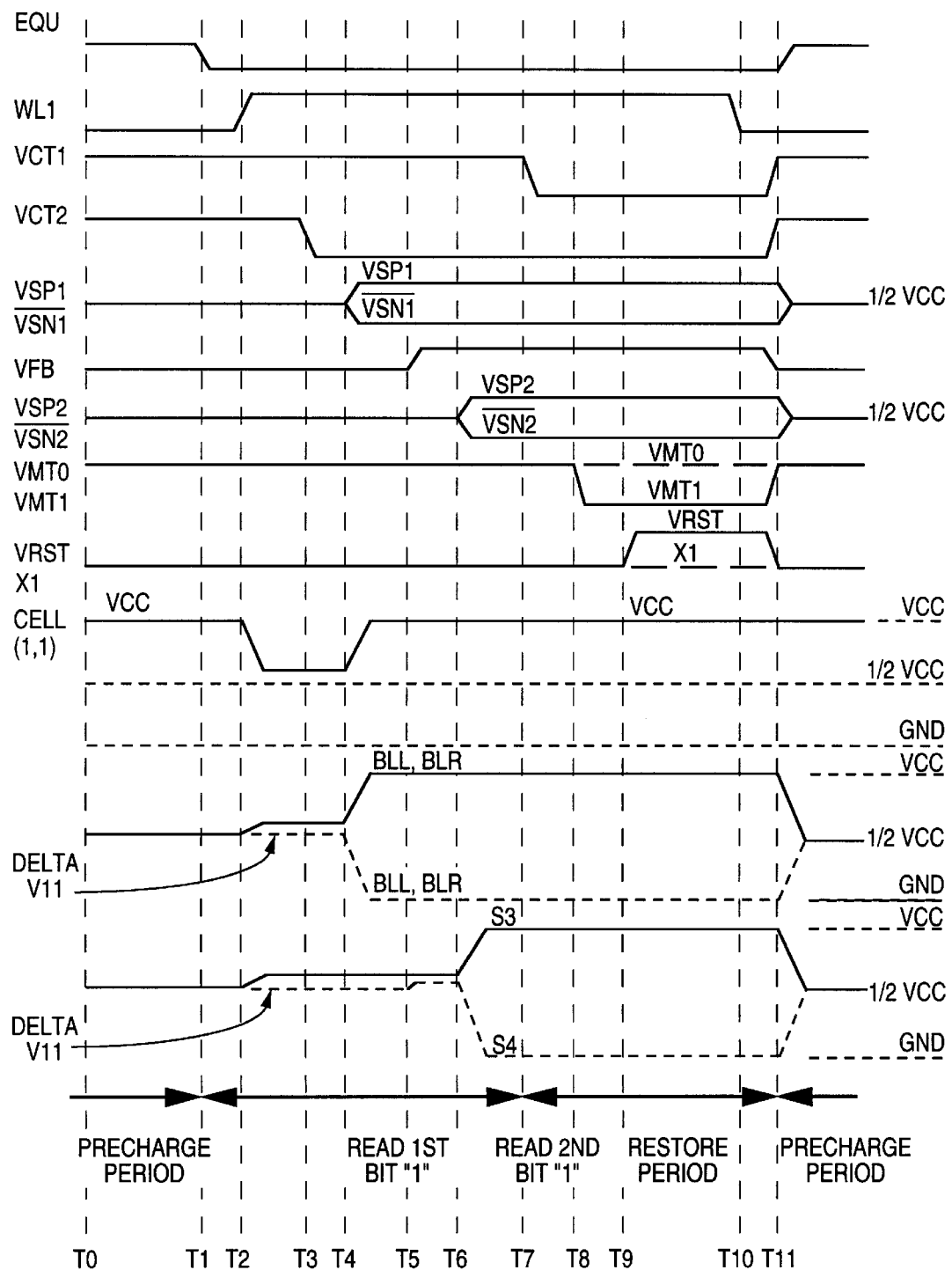
FIG. 4 is a timing chart showing the sequence of input voltage changes applied to the DRAM of FIG. 2 and selected internal voltage changes during a read and restore of a strong one (binary 11).

FIG. 4 is a timing chart showing voltage inputs and internal voltages during read and restore of voltage V11, V11 being the stored voltage on capacitor CS1, for example, representing binary 11, where the first bit is 1 and the second bit is 1. FIG. 4 shows the voltage on bitline BL increasing at time T2 by the amount "Delta V11". This voltage increase also occurs on bus S3 (shown) and on bus S1 (not shown) and is given by the expression Delta $V11=+[(V11-VPL)*CS/(CB+CS)]$.

where VPL is the voltage on the plate side of the capacitor the charge on which is being read out (for example, CS1), CS is the capacitance (in suitable units) of memory capacitor CS1 and CB is the capacitance involved in charge redistribution, specifically the capacitance of the bit line and sense amp buses S1 and S3. Taking V11 as being equal to VCC as in the Table and as in FIG. 4, and taking VPL equal to ½ VCC for example, then Delta $V11=+[½\ VCC*CS/(CB+CS)]$.

The magnitude of Delta V11, for example, if CB is ten times CS, is 1/22 VCC. For example, Delta V11 may be 150 mV.

At time T3 the voltage on lead VCT2 drops from VCC+ to GND, thereby shutting off pass transistors N26 and N27 and isolating sense amp two from bitline BL and reference bit line $\overline{BL}$ and thus retaining, for later use, the voltage (½ VCC+Delta V11) at bus S3 and the voltage ½ VCC at bus S4.

Sense amp one, which is turned "on" at time T4 as the voltage on lead VSP1 goes to VCC and the voltage on lead $\overline{VSN1}$ goes to ground, senses the voltage difference between buses S1 and S2, the difference being Delta V11. Transistors P1 and N4 turn "on", transistors P2 and N3 remain "off", and the voltage on bus S1 rises to VCC through transistor P1 connected to input lead VSP1 while the voltage on bus S2 drops to GND through transistor N4 connected to input lead $\overline{VSN1}$. Because the voltage on lead VCT1 is still high at VCC+, transistors N5 and N6 are "on" so that bit line BL is driven high to VCC and reference bit line $\overline{BL}$ is driven low to GND by sense amp one.

Pass transistors N1 and N2 are turned "on" when the voltage on DSL1 goes high (not shown in FIG. 3). At this time the high voltage on bus S1 and the low voltage on bus S2 are transmitted to data lines D0 and $\overline{D0}$, respectively. These two data lines are two of the four data lines from the system and provide to external circuitry one bit (in this case a binary 1) of the two bits of information stored on capacitor CS1.

The second bit of information stored on capacitor CS1 is provided by sense amp two. At time T5, the voltage difference between S3 and S4 in sense amp two is changed from Delta V11 to (Delta V11−Delta VFB). Delta VFB is the increase in voltage on bus S4 caused by voltage VCC being applied through input lead VFB and transistor N24 to capacitor C9. This increases the voltage at S4 by the amount Delta VFB. The magnitude of the voltage Delta VFB is set during design by choosing the size of capacitor C9 in relation to the other capacitances in series with C9. In the example where Delta V11 is 150 mV (Delta V11 is the voltage on bus S3 after time T3 and at time T5), Delta VFB may be 100 mV so that the signal (Delta V11−Delta VFB) across nodes C and D of sense amp two is+50 mV. Thus, when the voltage on lead $\overline{VSN2}$ goes low to GND and the voltage on lead VSP2 goes high to VCC, as they do at time T6 shortly following the voltage on VFB going high, sense amp two is activated, with transistors P3 and N29 turning "on" while transistors P4 and N28 remain "off". Thus the voltage on bus S3 goes high to the voltage VCC on VSP2 and the voltage on bus S4 goes low to the GND voltage on $\overline{VSN2}$.

Pass transistors N32 and N33 are turned "on" when DSL2 goes high (not shown in FIG. 4). Thus, the high (VCC) voltage on bus S3 and the low (GND) voltage on bus S4, respectively, are passed through pass transistors N32 and N33, respectively, to the data lines D1 and $\overline{D1}$. Thus, two bits of data have been read in the form of voltage V11 from one capacitor to give the output binary 1 (the first bit) on data line D0 and the output binary 1 (the second bit) on data line D1.

As shown in FIGS. 3 and 4, the restore period begins at time T7 when the voltage on lead VCT1 goes low to GND, thus turning "off" pass transistors N5 and NG and thereby isolating sense amp one from bitline BL which is at VCC and from reference bit line $\overline{BL}$ which is at GND. Note that the voltage on cell CS1 has been at VCC since time T4. The voltages on VMT0 and VMT1 remain high until shortly after VCT1 goes low and then VMT1 goes low thereby disconnecting left reference bit line $\overline{BLL}$ from right reference bit line $\overline{BLR}$.

Transistors N22 and N23 in FIG. 2, provide at node X4 the exclusive OR of the two binary values recently read from capacitor CS1. These two binary values are both 1 so that the output signal of the exclusive OR should be binary 0. In the present case, the exclusive OR output signal at node X4 is indeed binary 0, the low voltage on bus S4 being passed through transistor N22, which is turned on by voltage VCC on its gate, to node X4. With the voltage low at node X4, transistor N21 is off, so that when the voltage on lead VRST goes high at time T9 this voltage on lead VRST is blocked at transistor N21, transistor N20 remains "off" and bit line BL remains at VCC. Thus the voltage on the access side of capacitor CS1 remains at VCC through time T11, the end of the restore period as defined in FIG. 4. At time T10 the voltage on lead WL1 goes low, shutting off access transistor N10 and leaving the voltage V11 on capacitor CS1. Thus the voltage V11 equal to VCC representing a first bit having value 1 and a second bit having value 1 is restored to capacitor CS1, in this example.

Note, the voltage on lead VMT0 will go low at time T8 if memory cell CS4 (or any memory cell the state of which is read out to $\overline{BL}$) is being restored while VMT1 will go low at time T8 if memory cell CS1 (or any memory cell the state of which is read out to BL) is being restored. VMT0 going low shuts off pass transistor N14 while VMT1 going low shuts off pass transistor N15.

Figure 5:
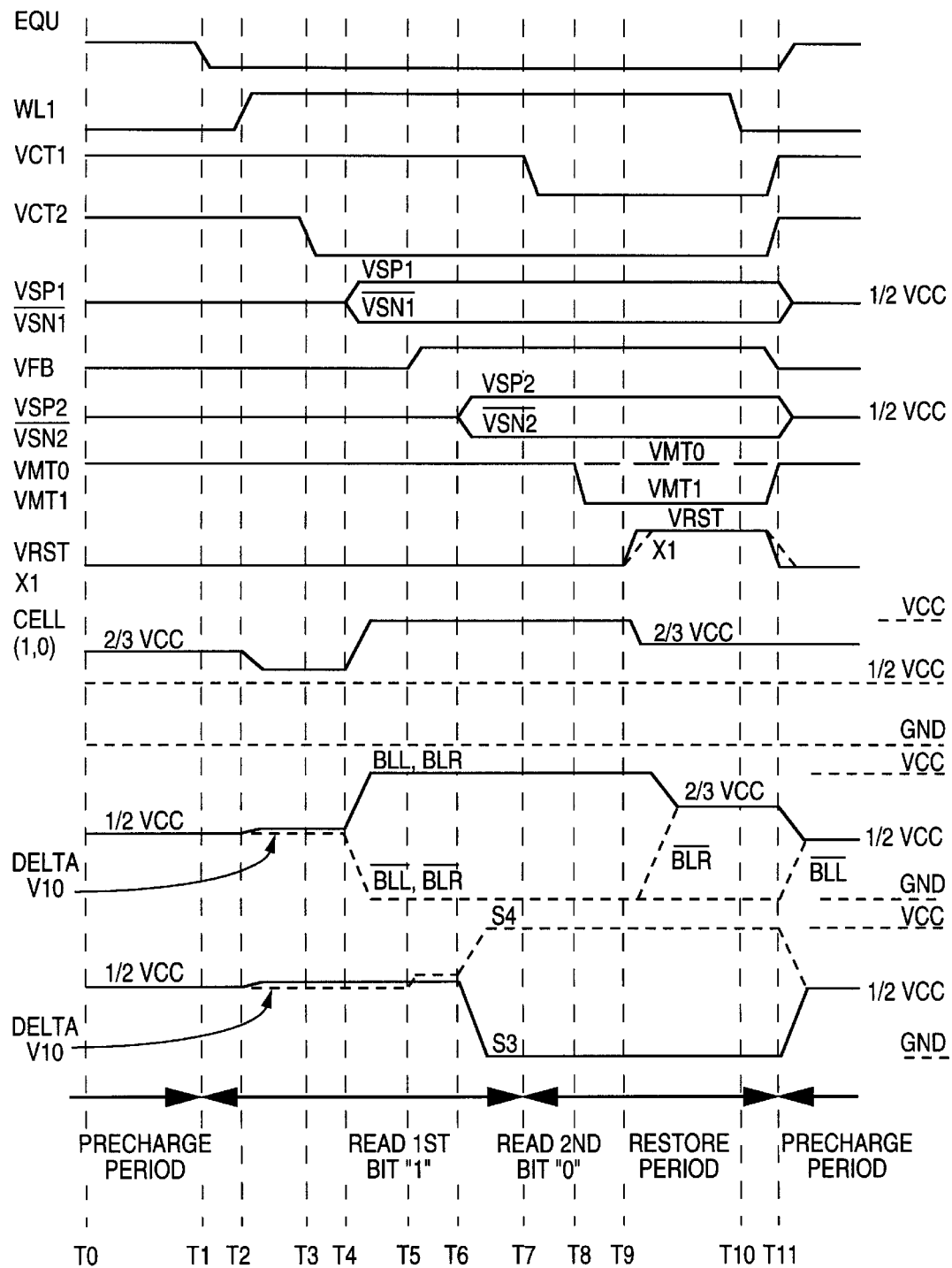
FIG. 5 is a timing chart showing the sequence of input voltage changes applied to the DRAM of FIG. 2 and selected internal voltage changes during a read and restore of a weak one (binary 10).

FIG. 5 is a timing chart showing the sequence of voltage inputs and selected internal voltages for the read and restore of voltage V10 representing a first bit having value 1 and a second bit having value 0. The stored voltage V10 is given by the expression $V10=VCC*[(CBLL+CBLR)/(\overline{CBLR}+CBLL+CBLR)]$.

The origin of this expression will become clear when V10 is restored below. In the case where the bitline capacitances CBLL, CBLR and $\overline{CBLR}$ are made approximately equal, V10 is approximately ⅔ VCC. With a voltage of ⅔ VCC on the access transistor side of capacitor CS1 and the plate voltage VPL at ½ VCC on the other side of capacitor CS1 the voltage across capacitor CS1 is ⅙ VCC. The voltage increase on bus S1, bit line BL and bus S3, due to charge sharing at time T2, is given by Delta $V10=+[(V10-VPL)*CS/(CB+CS)]$ Since, in the present example, V10 is taken as ⅔ VCC and VPL is taken as ½ VCC, then Delta $V10=+[⅙\ VCC*CS/(CB+CS)]$ Thus, in this example, Delta V10 is one third of Delta V11. A typical value of Delta V10 may be 50 mV. This voltage difference, Delta V10, exists at time T3 between buses S1 and S2 in sense amp one and between buses S3 and S4 in sense amp two. Thus, when sense amp one is activated at time T4 by the voltages on leads VSP1 and $\overline{VSN1}$ going high and low, respectively, bit line BL goes high to VCC and bit line $\overline{BL}$ goes low to GND. When the voltage on lead DSL1 goes high (not shown in FIG. 5) the first stored bit representing V10 appears on data line D0 as a binary 1 and the inverse of the first stored bit appears as a binary 0 on data line $\overline{D0}$.

At time T5, the difference between the voltages on buses S3 and S4 is changed, by means of negative feedback, from Delta V10 to (Delta V10−Delta VFB). In this example, Delta V10 is 50 mV and Delta VFB is 100 mV so that (Delta V10−Delta VFB) is negative 50 mV. Thus, when sense amp two is activated at time T6 by the voltages on leads VSP2 and $\overline{VSN2}$ going high (VCC) and low (GND) respectively, bus S3 goes to GND (transistor N28 is turned on) and bus S4 goes high to VCC (transistor P4 is turned on). When DSL2 goes high (not shown in FIG. 5), the GND voltage at S3 is passed to data line D1. Thus the value of the second stored bit is read on data line D1 and is binary 0.

Thus, the values of a first bit and a second bit have been read from a single capacitor, the values being 1 and 0, respectively, the value 1 of the first bit being output to data line D0 and the value 0 of the second bit being output to data line D1.

In FIG. 5 the restore period is shown as beginning at T7 when the voltage on VCT1 goes low to isolate the bit line BL and reference bit line $\overline{BL}$ from sense amp one. At time T8 VMT1 goes low turning transistor N15 "off" and isolating left reference bit line $\overline{BLL}$ from right reference bit line $\overline{BLR}$. The exclusive OR gate consisting of transistors N22 and N23 gives an output voltage at node X4 which voltage is the exclusive OR of the first bit and the second bit. In this case where the first bit has value 1 and the second bit has value 0, the output signal at node X4 is binary 1, a high voltage. The high voltage at node X4 turns transistor N21 "on" and when the voltage on lead VRST goes high at time T9, the voltage on node X1 goes high (FIG. 5) turning transistor N20 "on". Thus the left bit line BLL which is at VCC and the right bit line BLR which is at VCC are electrically connected through transistor N20 to the right reference bit line $\overline{BLR}$ which is at GND. The resulting voltage is $$V10=VCC*[(CBLL+CBLR)/(\overline{CBLR}+CBLL+CBLR)].$$

Since word line WL1 is high, this voltage V10 is present on the access side of CS1. As mentioned previously, the voltage V10 is typically about ⅔ VCC when the capacitances CBLL, CBLR and $\overline{CBLR}$ are all made approximately equal. At time T10, word line WL1 goes low turning transistor N10 "off" and isolating capacitor CS1 with the voltage V10 equal to approximately ⅔ VCC being restored on capacitor CS1.

Figure 6:
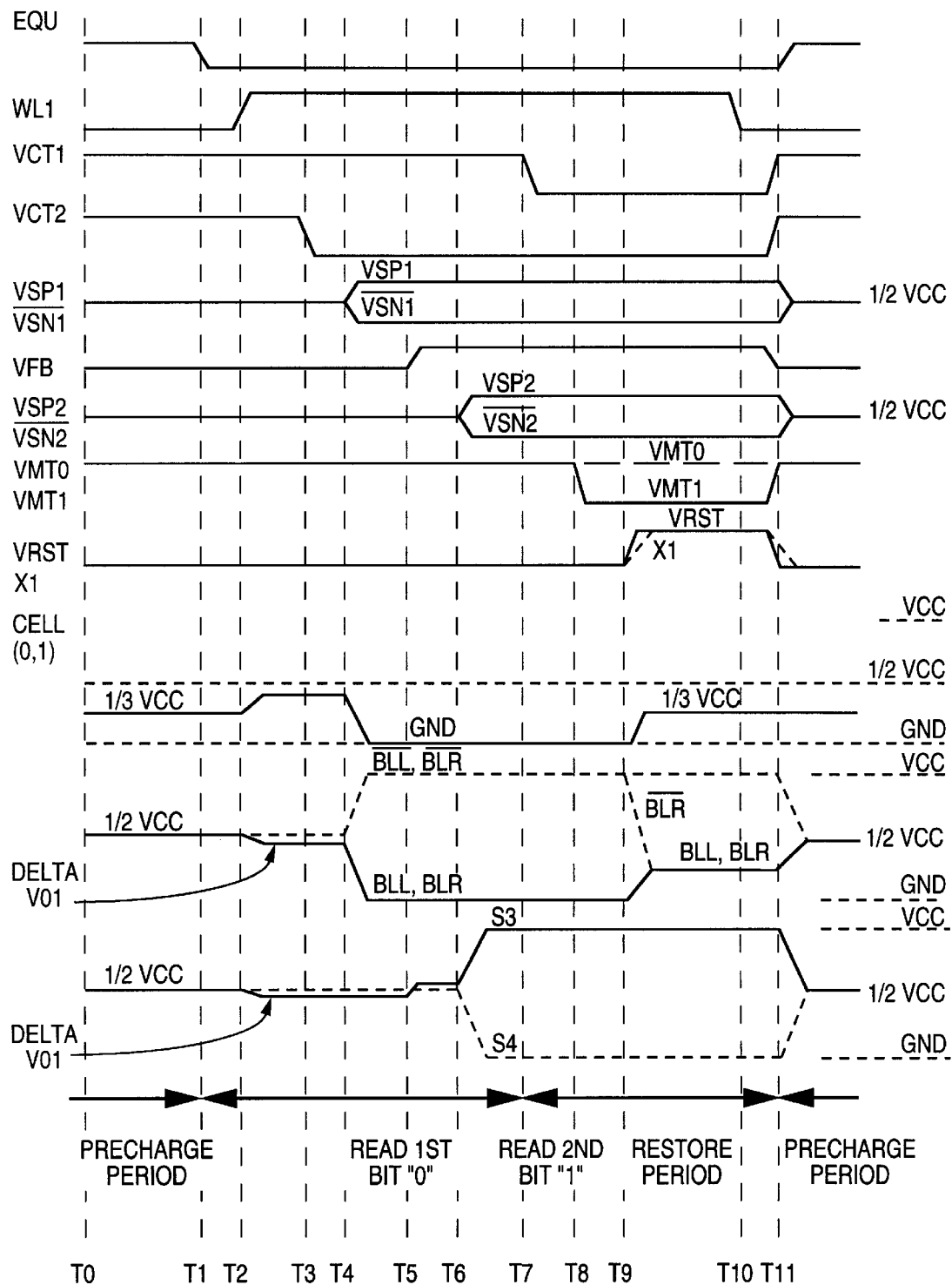
FIG. 6 is a timing chart showing the sequence of input voltage changes applied to the DRAM of FIG. 2 and selected internal voltage changes during a read and restore of a weak zero (binary 01).

FIG. 6 is a timing chart showing the voltage levels on the identified leads and selected voltages internal to the structure of FIG. 2 during read and restore of voltage V01 (a weak "zero") representing a first bit having value 0 and a second bit having value 1. The voltage V01, stored, for example, in memory capacitor CS1, is given by the expression $$V01=VCC*[(\overline{CBLR})/(\overline{CBLR}+CBLL+CBLR)].$$

In the case where the bit line capacitances CBLL, CBLR and $\overline{CBLR}$ are made approximately equal, V01 is approximately ⅓ VCC. After charge sharing at time T2 (i.e. after the application of a high voltage to lead WL1 to turn "on" access transistor N10), the voltage change on bus S1, bit line BL and bus S3 is given by the expression $$\text{Delta } V01=+[(V01-VPL)*CS/(CB+CS)].$$

Since, in the present example, V01 is taken as ⅓ VCC and VPL is taken as ½ VCC, then $$\text{Delta } V01=-[\tfrac{1}{6} VCC*CS/(CB+CS)].$$

In this example, Delta V01 is negative 50 mV. Thus, at time T3, the voltage on bus S1 is 50 mV lower than the voltage on bus S2 and the voltage on bus S3 is 50 mV lower than the voltage on bus S4. Thus, when sense amp one is activated at time T4 (by the voltages on leads VSP1 and $\overline{VSN1}$ going high (VCC) and low (GND), respectively, the voltage on bit line BL (connected by transistor N3 to lead $\overline{VSN1}$) goes low to GND and the voltage on the reference bit line $\overline{BL}$ (connected by transistor P2 to lead VSP1) goes high to VCC. When the voltage on lead DSL1 in FIG. 2 goes high (not shown in FIG. 6) transistors N1 and N2 turn "on" and the value of the first bit stored on capacitor CS1 appears as a binary 0 on data line D0 and the inverse of the value of the first stored bit appears as a binary 1 on data line $\overline{D0}$.

At time TS, the difference between the voltages on buses S3 and S4 is changed, by means of negative feedback, from Delta V01 (a negative quantity) to (Delta V01+Delta VFB). At time T5, the signal on lead VFB goes high. Because the signal on bus $\overline{BL}$ is high (VCC), N type transistor N25 is turned on. The high voltage on VFB is passed through transistor N25 to capacitor C10 and there to bus S3 connected to node C in sense amp 2. The change in voltage on bus S3 is Delta VFB. In this example Delta VFB is 100 mV so that (Delta V01+Delta VFB) is positive 50 mV. Thus, when sense amp two is activated at time T6 by the voltages on buses VSP2 and $\overline{VSN2}$ going high (VCC) and low (GND), respectively, the voltage on bus S3 (connected by transistor P3 to bus VSP2) goes high to VCC and the voltage on bus S4 (connected by transistor N29 to bus $\overline{VSN2}$) goes low to GND. When DSL2 goes high, transistors N32 and N33 turn "on" and the second bit stored on CS1 appears as binary 1 on data line D1. The inverse of the second bit stored on capacitor CS1 appears as a binary 0 on data line $\overline{D1}$. Thus a weak zero, corresponding to the voltage V01, has been read out of the memory.

In the restore period, the voltage on VCT1 goes low at time T7 to isolate bit line BL and reference bit line $\overline{BL}$ from sense amp one, and the voltage on VMT1 goes low at time T8 to divide bitline $\overline{BL}$ and isolate $\overline{BLR}$. In this case of a weak zero, the exclusive OR consisting of transistors N22 and N23 passes the high voltage on bus S3 through transistor N23 (turned on by the high voltage on reference bus $\overline{BL}$) to node X4. The high voltage at node X4 turns transistor N21 "on" and when the voltage on lead VRST goes high at time T9, the voltage on node X1 goes high (FIG. 6) turning "on" transistor N20. Thus left bit line BLL at GND and right bit line BLR at GND are electrically connected to right reference bit line $\overline{BLR}$ at VCC. The resulting voltage on all three of these bit lines is $$V01=VCC*[(\overline{CBLR})/(\overline{CBLR}+CBLL+CBLR)].$$

Since the voltage on word line WL1 is high this voltage is present on the access side of capacitor CS1. At time T10 word line WL1 goes low turning transistor N10 "off" and isolating capacitor CS1 which has had restored on it the voltage V01. Thus, the original voltage V01 has been restored on capacitor CS1. As mentioned previously, voltage V01 is typically approximately ⅓ VCC when the capacitances CBLL, CBLR and $\overline{CBLR}$ are chosen to be approximately equal.

Figure 7:
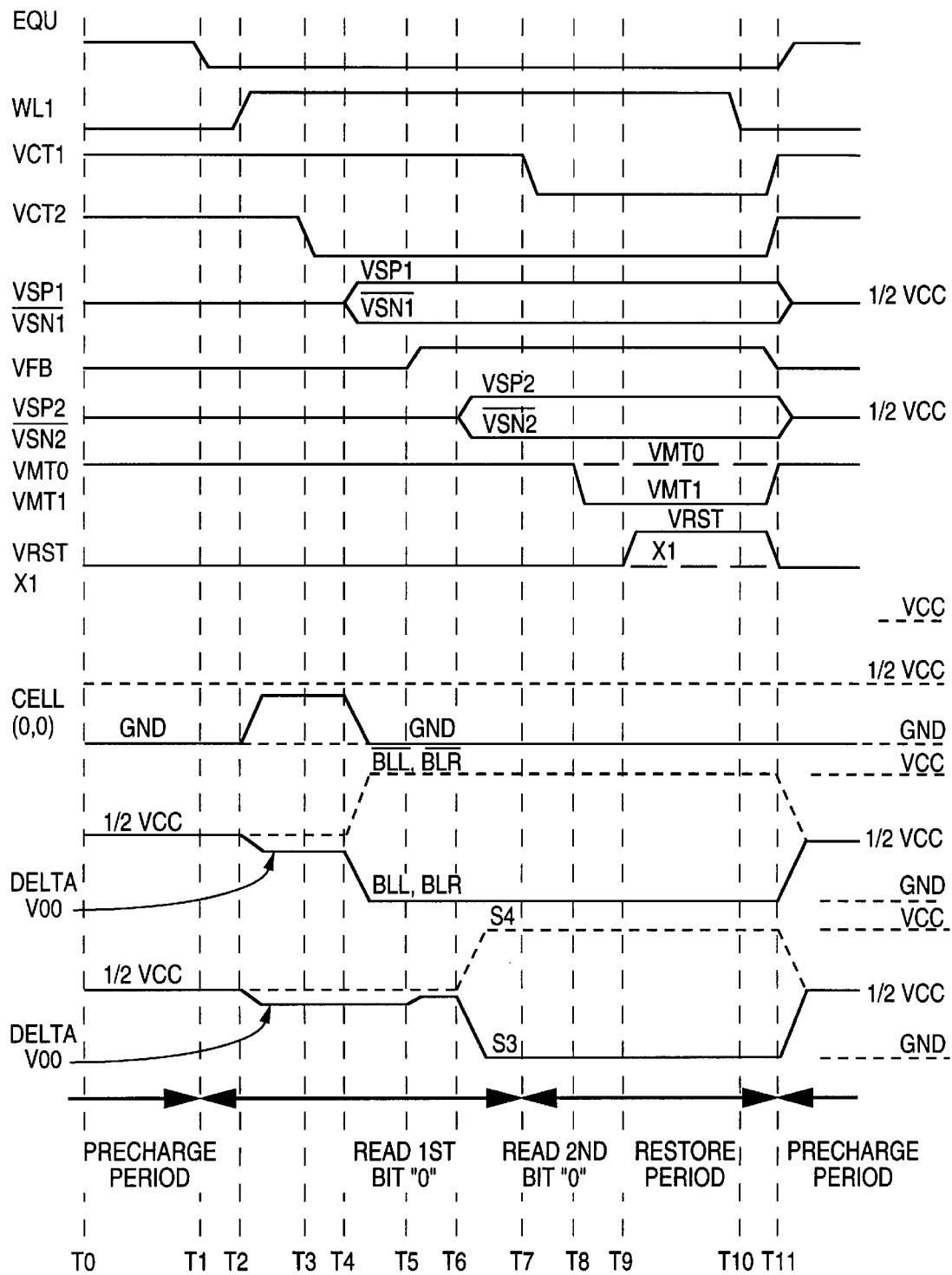
FIG. 7 is a timing chart showing the sequence of input voltage changes applied to the DRAM of FIG. 2 and selected internal voltage changes during a read and restore of a strong zero (binary 00).

FIG. 7 is a timing chart showing the voltages on the identified leads and selected voltages internal to the structure of FIG. 2 during read and restore of voltage V00 representing a first bit having value 0 and a second bit having value 0 (i.e. a strong zero). In this example, V00 is taken to be zero volts or GND. After charge sharing at time T2 due to a high voltage on lead WL1, Delta V00, the voltage change on bus S1, bit line BL and bus S3, is Delta $V00=[(V00-VPL)*CS/(CB+CS)]$.

Since, in the present example, V00 is taken as 0 volts and VPL is taken as ½ VCC, then Delta $V00=-[½ VCC*CS/(CB+CS)]$ A typical value of Delta V00 is negative 150 mV. Thus at time T3 when the voltage on lead VCT2 goes low cutting off buses S3 and S4 from bit lines BL and $\overline{BL}$, the voltage on bus S1 is 150 mV lower than the voltage on bus S2 and the voltage on bus S3 is 150 mV lower than the voltage on bus S4. Thus, when sense amp one is activated at time T4 by the voltages on leads VSP1 and $\overline{VSN1}$ going high (VCC) and low (GND), respectively, the voltage on bit line $\overline{BL}$ goes low to GND and the voltage on bit line $\overline{BL}$ goes high to VCC. When the voltage on lead DSL1 in FIG. 2 goes high (not shown in FIG. 7), transistors N1 and N2 turn "on" and the value of the first bit stored in CS1 appears as binary 0 on data line D0 and the inverse of the value of the first bit appears as binary 1 on data line $\overline{D0}$.

At time T5, the voltage difference between buses S3 and S4 in sense amp two is changed, by means of negative feedback from the output bus S2 of sense amp one, from Delta V00 to (Delta V00+Delta VFB). In this example Delta VFB is 100 mV so that (Delta V00+Delta VFB)=−50 mV. Thus the voltage on bus S3 is 50 mV less than the voltage on bus S4 and when sense amp two is activated by the voltages on leads VSP2 and $\overline{VSN2}$ going high and low respectively, the voltage on bus S3 goes to GND and the voltage on bus S4 goes high to VCC. When the voltage on lead DSL2 goes high, transistors N32 and N33 turn "on" and the value of the second bit from capacitor CS1 appears as a binary 0 on data line D1. The inverse of the value of the second data bit from CS1 appears as a binary 1 on data line $\overline{D1}$.

In the restore period beginning at time T7, when the voltage on lead VCT1 goes low, the output voltage at node X4 of the exclusive OR consisting of transistors N22 and N23 remains low so that BLR is not shorted to $\overline{BLR}$ and the voltage on BL and consequently on CS1 remains at GND or zero thus restoring the original voltage and data on capacitor CS1.

While FIG. 2 shows pass transistors N1 and N2, N5 and N6, N14 and N15, N26 and N27, and N32 and N33, as being N channel pass transistors, if desired, these pass transistors can be replaced by pass gates comprising parallel connected N channel and P channel transistors. Similarly, pass transistors N20 and N21 can be replaced by such pass gates. The replacement of N channel pass transistors by pass gates results however in a slight increase in the number of transistors in the circuit and thus increases the area of the circuitry. The advantage of using pass gates is to eliminate the need for the voltage VCC+ (see FIG. 3) and thus simplifies the circuitry required to provide the various supply and reference voltages used in the circuit.

Figure 8:
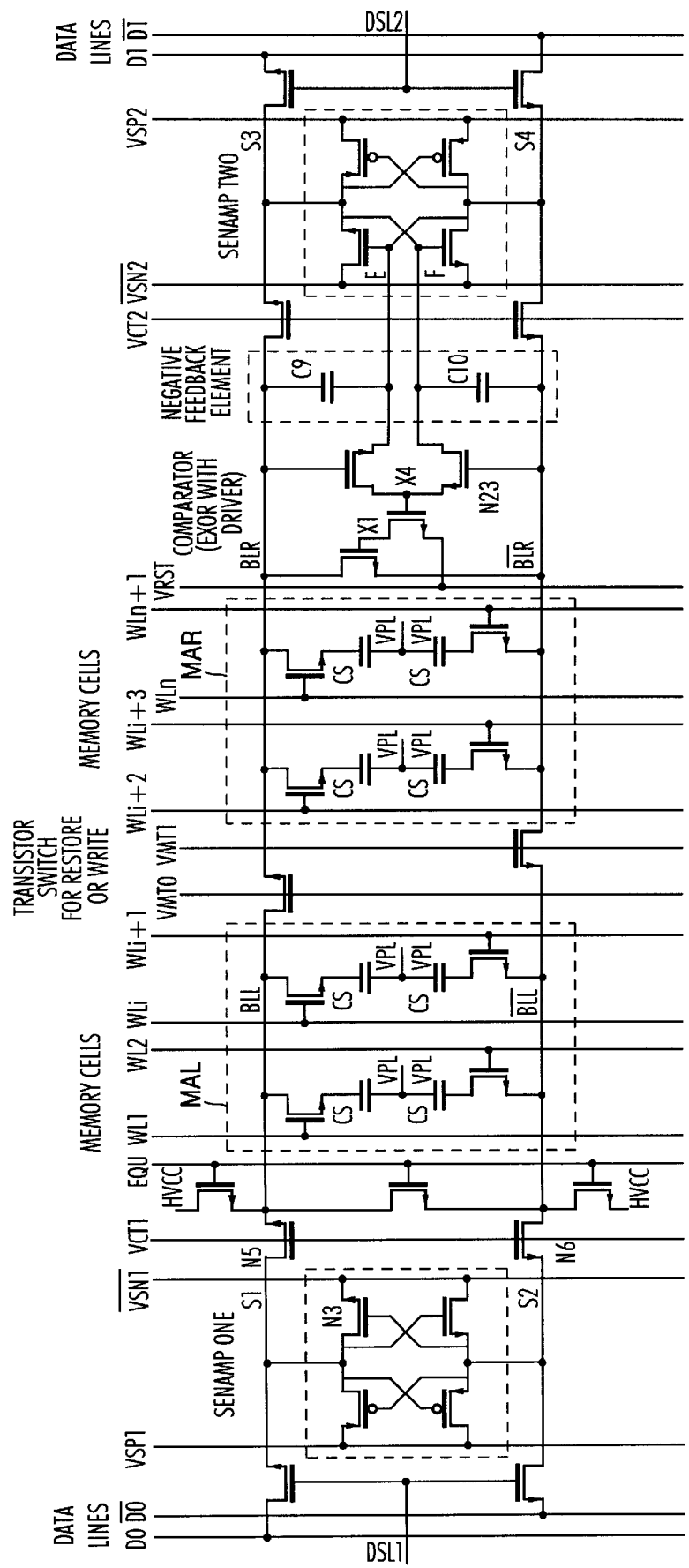
FIG. 8 is a circuit diagram of an alternative embodiment to the circuit of FIG. 2.

An alternative embodiment is shown in FIG. 8. In FIG. 8, the memory arrays MAL and MAR are similar to those shown in FIG. 2 as are the sense amplifiers. However, the negative feedback element shown in FIG. 8 differs from the negative feedback element shown in FIG. 2 by relying upon the capacitors C9 and C10 to basically charge pump the nodes E and F of sense amp 2 after the voltage on lead VCT2 goes low. The voltage on VCT2 going low isolates buses S3 and S4 of sense amp 2. Then, after the signals on leads VSP1 and $\overline{VSN1}$ go high and low, respectively, the voltages on bit line BL and reference bit line $\overline{BL}$ are driven high and low, respectively, for sense amp one producing a binary 1 on output lead D0. On the other hand, the voltages on BL and $\overline{BL}$ are driven low and high, respectively, when sense amp one produces a low level signal on output data line D0 and a high level signal on output data line $\overline{D0}$. The driving, for example, of right bit line BLR high results in capacitor C9 driving node E by the amount of change in the voltage in the bit line BLR following WL1 going high (when charge flows out of the capacitor such as CS1 onto bit lines BLL and BLR and also onto sense amp buses S1 and S3). The voltage on bit line BLR is then raised to a higher voltage level VCC when sense amp 1 is turned on by VSP1 going high and $\overline{VSN1}$ going low. Thus the voltage on node E is lifted to a higher level by this voltage rise. Alternatively, node E is driven to a lower level should the voltage change on bit line BLR be in the opposite direction. In any event, the structure of the embodiment of FIG. 8 works as described above with respect to the embodiment of FIG. 2.

To write information into a memory cell included in the structure of FIG. 2, the signal to be written into the memory is applied to data lines D0, $\overline{D0}$ and D1, $\overline{D1}$. The signals are written into sense amps 1 and 2 after the time T3 (see FIG. 3) when the signal on lead VCT2 has gone to a low level thereby isolating sense amp 2 from the remainder of the structure shown in FIG. 2. Following time t3, the voltages on leads DSL1 and DSL2 are raised to a high level thereby turning on pass transistors N1 and N2 and also turning on pass transistors N32 and N33. Consequently, the signal on data lines D0, $\overline{D0}$ is passed into sense amp 1 and the signal on data lines D1 and $\overline{D1}$ is passed into sense amp 2. The circuitry then operates as in the restore previously described to store the information contained in sense amps 1 and 2 in the appropriate memory cell of the memory array.

As described above in conjunction with FIG. 2, certain N type pass transistors used in the circuit of FIG. 8 can be replaced with pass gates at the price of adding additional transistors but thereby to eliminate the need to generate VCC+.

Other embodiments of this invention will be understood in view of the above disclosure. This disclosure is illustrative only and not limiting.

While this invention has been described as being implemented using predominantly N channel transistors, the conductivity types of the transistors can be reversed so that the invention is implemented using predominantly P channel transistors. Under this circumstance the control signals would be the inverse of the complements of those described in this invention.

I claim:

1. A memory circuit comprising:
   a plurality of memory cells each capable of storing one of four signal values representative of two binary bits of data;
   a first sense amplifier having first and second sense nodes coupled to said plurality of memory cells, said first sense amplifier detecting a binary value of a first bit of said two binary bits of data and generating an output signal;

a second sense amplifier having first and second sense nodes coupled to said plurality of said memory cells; and a feedback circuit coupled to said first and second sense nodes of said second sense amplifier, wherein when activated said feedback circuit couples charge to one of said first or second sense nodes of said second sense amplifier in response to said output signal, allowing said second sense amplifier to detect a binary value of a second bit of said two binary bits of data.

2. The memory circuit of claim 1 further comprising:

a first bit line coupling a plurality of memory cells to said first sense nodes of said first and second sense amplifiers; and a second bit line coupling a plurality of memory cells to said second sense nodes of said first and second sense amplifiers;

wherein, said feedback circuit comprises a first terminal coupled to said first bit line and a second terminal coupled to said second bit line.

3. The memory circuit of claim 2 wherein said feedback circuit further comprises:

a first transistor having a gate terminal coupled to said first terminal, a first source/drain terminal coupled to a feedback signal source, and a second source/drain terminal capacitively coupled to said first node of said second sense amplifier; and a second transistor having a gate terminal coupled to said second terminal, a first source/drain terminal coupled to said feedback signal source, and a second source/drain terminal capacitively coupled to said second node of said second sense amplifier.

4. The memory circuit of claim 1 further comprising an exclusive OR circuit coupled to receive said binary value of said first bit and said binary value of said second bit, said exclusive OR circuit controlling a restore operation in response to said binary value of said first bit and said binary value of said second bit.

5. The memory circuit of claim 4 further comprising a restore drive circuit coupled to an output lead of said exclusive OR circuit, said restore drive circuit restoring a signal value representative of said two bits of binary data in response to a restore signal.

6. The memory circuit of claim 1 wherein the memory circuit is of a dynamic random access memory type, and wherein each one of said plurality of memory cells comprises a cell capacitor coupled to a cell access transistor.

7. The memory circuit of claim 2 wherein said first bit line is divided into a first segment and a second segment coupled by a first pass transistor, and said second bit line is divided into a first segment and a second segment coupled by a second pass transistor.

8. The memory circuit of claim 7 wherein said first and second segments of said first bit line couple to said first nodes of said first and second sense amplifiers via third and fourth pass transistors, respectively, and wherein, said first and second segments of said second bit line couple to said second nodes of said first and second sense amplifiers via fifth and sixth pass transistors, respectively.

9. The memory circuit of claim 8 wherein said first segment of said first bit line is substantially equal in length to said second segment of said first bit line, and wherein, said first segment of said second bit line is substantially equal in length to said second segment of said second bit line.

10. The memory circuit of claim 9 further comprising a restore circuit comprising:

a first transistor having a gate terminal coupled to said second segment of said first bit line, a first source/drain terminal coupled to an output node, and a second source/drain terminal coupled to said second sense node of said second sense amplifier; and a second transistor having a gate terminal coupled to said second segment of said second bit line, a first source/drain terminal coupled to said output node, and a second source/drain terminal coupled to said first sense node of said second sense amplifier.

11. A dynamic memory circuit comprising:

a plurality of dynamic memory cells each capable of storing one of four signal values representative of two binary bits of data;

a first sense amplifier coupled to said plurality of memory cells, said first sense amplifier detecting a binary value of a first bit of said two binary bits of data stored in a selected memory cell;

a second sense amplifier coupled to said plurality of memory cells, said second sense amplifier detecting a binary value of a second bit of said two binary bits of data stored in the selected memory cell; and a restore circuit coupled to receive said binary value of said first bit at a first input and said binary value of said second bit at a second input, said restore circuit controlling a restore operation of the dynamic memory circuit in response to the binary values of said first and second bits.

12. The dynamic memory circuit of claim 11 wherein said restore circuit comprises an exclusive OR type circuit that receives said binary value of said first bit and a complement thereto, and said binary value of said second bit and a complement thereto, and generates an output signal.

13. The dynamic memory circuit of claim 12 wherein said restore circuit further comprises a restore driver circuit having a first input lead coupled to receive said output signal of said exclusive OR type circuit, and a second input lead coupled to receive a restore control signal.

14. A method of operating a dynamic memory circuit capable of storing two bits of data per memory cell, comprising the steps of:

generating a first voltage differential on a bit line by selecting a memory cell coupled thereto;

detecting the binary value of a first bit of data stored in said memory cell by sensing said voltage differential using a first sense amplifier;

coupling feedback charge to either a first or a second sense node of a second sense amplifier in response to the binary value of said first bit of data, thereby generating a second voltage differential; and detecting the binary value of a second bit of data by sensing said second voltage differential using said second sense amplifier.

15. The method of claim 14 wherein said step of generating a first voltage differential comprises the steps of:

precharging said bit line and a reference bit line to a first voltage; and coupling a charge stored in said memory cell to said bit line to generate a second voltage on said bit line.

16. The method of claim 15 wherein said step of detecting the binary value of a first bit of data comprises the steps of:

applying said first voltage and said second voltage to a first sense node and a second sense node of said first sense amplifier, respectively; and activating said first sense amplifier.

17. The method of claim 16 further comprising the step of applying said first voltage and said second voltage to said first sense node and said second sense node of said second sense amplifier, respectively, before said step of coupling feedback charge.

18. The method of claim 17 wherein said step of coupling feedback charge generates a third voltage on one of said first sense node and said second sense node of said second sense amplifier, and wherein said step of detecting the binary value of a second bit of data comprises the step of activating said second sense amplifier.

19. The method of claim 14 further comprising the steps of:
comparing the binary value of said first bit of data with the binary value of said second bit of data; and
controlling a restore operation in response to a result of said step of comparing.

20. The method of claim 19 wherein said step of comparing comprises a step of performing an exclusive OR operation on the binary values of said first and second bits of data.

21. A method of operating a dynamic memory circuit capable of storing two bits of data per memory cell, comprising the steps of:
generating a first voltage differential on a bit line by accessing a memory cell coupled thereto;
detecting the binary value of a first bit of data stored in said memory cell by sensing said first voltage differential using a first sense amplifier;
generating a second voltage differential in response to the binary value of said first bit of data;
detecting the binary value of a second bit of data by sensing said second voltage differential using a second sense amplifier; and
comparing the binary values of said first and second bits of data in order to restore the content of said memory cell.

22. The method of claim 21 wherein said step of comparing comprises a step of performing an exclusive OR operation on the binary values of said first and second bits of data.

23. A DRAM memory comprising:
a plurality of memory cells, each memory cell being capable of storing two bits of information, a first bit and a second bit;
a first sense amplifier for reading out from any one of said plurality of memory cells the state of said first bit;
a second sense amplifier for reading out from said one of said plurality of memory cells the state of said second bit;
a first pair of data leads adapted to send to and receive from said first sense amplifier a first pair of signals representing said first bit and the complement of said first bit;
a second pair of data leads adapted to send to and receive from said second sense amplifier a second pair of signals representing said second bit and the complement of said second bit; and,
circuitry for writing into a selected one of said plurality of memory cells a signal representing said first bit and said second bit, including:
a bit line adapted to receive the signal representing said first bit from said first sense amplifier;
a reference bit line adapted to receive the signal representing the complement of said first bit from said first sense amplifier;
an exclusive OR gate adapted to receive said pair of signals representing said first bit and the complement of said first bit and to receive said pair of signals representing said second bit and the complement of said second bit and to produce a signal representing the exclusive "OR" of said first bit and said second bit;
a first transistor switch for dividing the reference bit line into two parts;
a second transistor switch, capable of connecting said bit line to one of the two parts of said reference bit line; and
a restore signal line connected so that when the restore signal is high and the exclusive "OR" output signal is high, the second transistor switch is "ON" and the bit line is connected to said one part of the reference bit line and so that when the restore signal is high and the exclusive "OR" output signal is not high the second transistor switch is "OFF" and the bit line is not connected to said one part of the reference bit line.

24. A method of processing data in a DRAM, the method comprising:
connecting a first node of a first sense amplifier to a bit line;
connecting a second node of the first sense amplifier to a reference bit line;
connecting a first node of a second sense amplifier to said bit line; and
connecting a second node of the second sense amplifier to said reference bit line;
connecting a reference voltage source to the bit line and to the reference bit line and then disconnecting the reference voltage source to leave the reference voltage on the bit line and on the reference bit line;
selecting a memory cell capacitor having a voltage stored therein, said stored voltage being one of a set consisting of $V_{00}$, $V_{01}$, $V_{10}$ and $V_{11}$, where $V_{00}$ and $V_{01}$ are less than the reference voltage, $V_{10}$ and $V_{11}$ are greater than the reference voltage, $V_{00}$ is less than $V_{01}$, and $V_{10}$ is less than $V_{11}$;
accessing the selected memory cell capacitor by connecting the selected memory cell capacitor to the bit line to change the bit line voltage by delta V, where delta V, a certain fraction of the stored voltage, is one of a set consisting of delta $V_{00}$, delta $V_{01}$, delta $V_{10}$, and delta $V_{11}$ corresponding to $V_{00}$, $V_{01}$, $V_{10}$, and $V_{11}$, respectively, where delta $V_{00}$ and delta $V_{01}$ are negative, delta $V_{10}$ and delta $V_{11}$ are positive, delta $V_{01}$ is greater than delta $V_{00}$, and delta $V_{11}$ is greater than delta $V_{10}$;
disconnecting the second sense amplifier from the bit line and from the reference bit line;
activating the first sense amplifier to produce a first output bit having one of the values "0" and "1", where a first bit output value "0" indicates negative delta V and indicates that the stored voltage on the accessed capacitor was one of the set of voltages $V_{00}$ and $V_{01}$ that are less than the reference voltage, and where a first bit value "1" indicates positive delta V and indicates that the stored voltage on the accessed capacitor was one of the set of voltages $V_{10}$ and $V_{11}$ that are greater than the reference voltage;
allowing the voltages on the bit line and on the reference bit line to follow the state of the first sense amplifier so that for a first bit value "1" the bit line goes to Vcc and the reference bit line goes to ground and so that for a first bit value "0" the bit line goes to ground and the reference bit line goes to Vcc;

applying the state of the first sense amplifier to a feedback structure to change the voltage difference between the first and second nodes in the second sense amplifier, for first bit value "0", from delta $V_{00}$ to (delta $V_{00}$+delta $V_{FB}$) and from delta $V_{01}$ to (delta $V_{01}$+delta $V_{FB}$), and for first bit value "1", from delta $V_{10}$ to (delta $V_{10}$−delta $V_{FB}$) and from delta $V_{11}$ to (delta $V_{11}$−delta $V_{FB}$), where delta $V_{FB}$ is intermediate in value between delta $V_{10}$ and delta $V_{11}$ and intermediate in value between the magnitude of delta $V_{00}$ and the magnitude of delta $V_{01}$ so that (delta $V_{00}$+delta $V_{FB}$) is negative, (delta $V_{01}$+delta $V_{FB}$) is positive, (delta $V_{10}$−delta $V_{FB}$) is negative, and (delta $V_{11}$−delta $V_{FB}$) is positive; and activating the second sense amplifier to produce a second output bit having values "0" for stored voltage $V_{00}$, "1" for stored voltage $V_{01}$, "0" for stored voltage $V_{10}$, and "1" for stored voltage $V_{11}$.

25. The method of claim 24, wherein the feedback structure comprises a feedback lead coupled through the channel of a first transistor to a first capacitor and through the first capacitor to the second node of the second sense amplifier, said first transistor having a gate connected to the bit line, said feedback lead being coupled through the channel of a second transistor to a second capacitor and through the second capacitor to the first node of the second sense amplifier, said second transistor having a gate connected to the reference bit line, so that when a signal is applied to the feedback lead, the voltage delta $V_{FB}$ is added to the second node of the second sense amplifier when the first bit is "1", and to the first node of the second sense amplifier when the first bit is "0".

26. The method of claim 24, wherein the step of applying the state of the first sense amplifier to a feedback structure includes the step of applying the voltages from the first and second nodes of the first sense amplifier to the gates of first and second transistors, respectively, said first and second transistors having first and second sources, respectively, connected through first and second capacitors, respectively, to the second and first nodes, respectively, of the second sense amplifier, and the step of applying a feedback signal to the drains of the first and second transistors includes the step of applying a fraction of the feedback signal, namely delta $V_{FB}$, at the first node of the second sense amplifier when the state of the first sense amplifier is "0" and delta $V_{FB}$ at the second node of the second sense amplifier when the state of the first sense amplifier is "1".

27. A method of restoring data to a DRAM cell capacitor comprising part of a memory circuit capable of storing two bits of information in each cell, said memory circuit including a bit line and a reference bit line, a first sense amplifier and a second sense amplifier, the method comprising:

outputting a first bit from the first sense amplifier and a second bit from the second sense amplifier and forming a signal representing the exclusive "OR" of the first bit and the second bit;

applying a signal to divide the reference bit line in half;

applying the exclusive "OR" signal so that when the value of the first bit is "1" and the value of the second bit is "0," the bit line is shorted to one half of the reference bit line to provide a voltage approximately equal to ⅔ Vcc, and so that when the value of the first bit is "0" and the value of the second bit is "1" the bit line is shorted to said one half of the reference bit line to provide a voltage approximately equal to ⅓ Vcc; and changing the voltage on a word line to isolate the cell capacitor from the bit line after the appropriate charge has been restored on the DRAM cell capacitor.

* * * * *